United States Patent
Uya et al.

(10) Patent No.: US 7,372,496 B2
(45) Date of Patent: May 13, 2008

(54) SOLID-STATE IMAGE CAPTURING DEVICE AND IMAGING APPARATUS USING THE SAME

(75) Inventors: Shinji Uya, Miyagi (JP); Yong Gwan Kim, Miyagi (JP); Tomohiro Sakamoto, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 643 days.

(21) Appl. No.: 10/329,780

(22) Filed: Dec. 27, 2002

(65) Prior Publication Data

US 2003/0122948 A1    Jul. 3, 2003

(30) Foreign Application Priority Data

Dec. 27, 2001    (JP)    ............... P.2001-397619

(51) Int. Cl.
  *H04N 3/14*    (2006.01)
  *H04N 5/335*    (2006.01)

(52) U.S. Cl. ..................................... 348/314

(58) Field of Classification Search ............... 348/312, 348/311, 280, 294, 316, 314, 299; 257/239, 257/240, 241; 250/214.1, 208.1
See application file for complete search history.

(56) References Cited

U.S. PATENT DOCUMENTS 5,063,439 A * 11/1991 Tabei ........................ 348/272
5,276,723 A * 1/1994 Miwada ...................... 377/60
6,157,053 A * 12/2000 Tanabe ....................... 257/239
6,310,369 B1 * 10/2001 Narabu et al. ............... 257/239
6,410,905 B1 * 6/2002 Heidtmann et al. ........ 250/214.1
6,570,618 B1 * 5/2003 Hashi ......................... 348/314
6,714,239 B2 * 3/2004 Guidash .................... 348/223.1

FOREIGN PATENT DOCUMENTS

| EP | 0917360 A2 | 5/1999 |
| JP | 63-209175 A | 8/1988 |
| JP | 5-136396 A | 6/1993 |
| JP | 5-292406 A | 11/1993 |
| JP | 7-122733 A | 5/1995 |
| JP | 10-135440 A | 5/1998 |
| JP | 11-331709 A | 11/1999 |
| JP | 11331706 A * | 11/1999 |

* cited by examiner

*Primary Examiner*—James M. Hannett
(74) *Attorney, Agent, or Firm*—Birch, Stewart, Kolasch & Birch, LLP

(57) ABSTRACT

An n-type semiconductor substrate 11 has a p-type well 12 in which are formed a charge transfer channel 13, a flowing diffusion region 14 made of an n-type impurity region, an n-type buried region 16 and a reset drain region 15. Transfer gates 51 and 52 of a horizontal CCD and an output gate 41 are formed on the surface of the charge transfer channel 13, with an insulation film 20 interposed; reset electrodes 31 and 32 are formed on the surface of the buried region 16, again with the insulation film 20 interposed. The floating diffusion region 14 is connected to a source follower circuit 6. The reset electrodes 31 and 32 are provided adjacent to each other in the channel direction of a reset gate section 3 and can be driven independently of each other.

29 Claims, 8 Drawing Sheets

SOLID-STATE IMAGE CAPTURING DEVICE AND IMAGING APPARATUS USING THE SAME

This nonprovisional application claims priority under 35 U.S.C. § 119(a) on Patent Application No. 2001-397619 filed in JAPAN on Dec. 27, 2001, which is herein incorporated by reference.

BACKGROUND OF THE INVENTION

1. Field of the Invention

The present invention relates to a solid-state image capturing device having a photoelectric transducer portion, a charge transfer portion for transferring a signal charge from the photoelectric transducer portion and a charge detector portion for detecting the signal charge, as well as an imaging apparatus using the solid-state image capturing device.

2. Description of the Related Art

A known conventional solid-state image capturing device is a CCD image capturing device capable of interline charge transfer. The CCD image capturing device has a two-dimensional matrix array of photoelectric transducer elements (pixels) that store incident light by converting it to a signal charge associated with its quantity, a plurality of vertical CCDs that are provided for the respective columns of photoelectric transducer elements and which transfer the signal charges vertically as they are read from the respective photoelectric transducer elements, a horizontal CCD that transfers the signal charge for one line (row) horizontally as it is being transferred from vertical CCDs, and a charge detector portion that outputs the signal charge transferred from the horizontal CCD after converting it to an electrical signal.

The charge detector portion of the CCD image capturing device under consideration has a floating diffusion amplifier configuration which is composed of a floating diffusion (FD) section by which the signal charges sequentially transferred from the horizontal CCD are converted to signal voltage (electrical signal), a reset drain (RD) section for draining charges, a reset gate (RG) section which clears the floating diffusion section of all charges so that they are dumped into the reset drain section, and a source follower circuit.

FIG. 12 shows a schematic configuration of a conventional CCD image capturing device, particularly the area around the charge detector portion. FIG. 12 is a diagrammatic representation of a cross-sectional profile of the final transfer stage 5 of the horizontal CCD, an output gate section 4, a floating diffusion section 1, a reset gate section 3 and a reset drain section 2, plus a circuit diagram for a source follower circuit 6. An n-type semiconductor substrate 11 has a p-type well 12 in which are formed a charge transfer channel 13, a flowing diffusion region 14 which is also made of an n-type impurity region and a reset drain region 15 also made of an n-type impurity region. Transfer gates 51 and 52 of the horizontal CCD and an output gate 41 are formed on the surface of the charge transfer channel 13, with an insulation film 20 interposed; a reset electrode 30 is formed between the floating diffusion region 14 and the reset drain region 15, again with the insulation film 20 interposed. The floating diffusion region 14 is connected to the source follower circuit 6.

In the output portion having the configuration shown in FIG. 12, the amount of change in the signal charge in the floating diffusion region 14 ($\Delta Q$), the change in voltage ($\Delta V$) and the static capacity (C) are related to each other by $\Delta V = \Delta Q/C$, describing that the sensitivity of signal voltage being output from the source follower circuit 6 (i.e., charge detection sensitivity) depends on the static capacity C of the floating diffusion region 14. Since the static capacity C of the floating diffusion region 14 which depends on the structures of the floating diffusion region 14 and its nearly area is constant, the charge detection sensitivity of the output portion is also constant.

As a result, if the charge detection sensitivity is raised by reducing the static capacity C in order to achieve sensitive imaging, the signal output in response to a quantity of incident light greater than a certain level becomes constant, producing a narrow dynamic range. A proposal for expanding the dynamic range by making the sensitivity of the charge detector portion variable is the solid-state image capturing device described in Japanese Patent Laid-Open No. 331706/1999.

The solid-state image capturing device described in Japanese Patent Laid-Open No. 331706/1999 changes the sensitivity of the charge detector portion between a mode for reading one pixel and a mode for reading more than one pixel. The change in charge detection sensitivity is in effect accomplished by changing the size of the floating diffusion region. The solid-state image capturing device under consideration has substantially the same structure as the device shown in FIG. 12, except that a plurality of adjacent reset gates are provided between the floating diffusion region and the reset drain region. By selectively driving the plurality of reset gates, the size of the floating diffusion region is altered to change its static capacity C. For instance, if the reset gate which is the closer to the floating diffusion region is held at a reset level whereas the other reset gates control charge storage and drain, the area beneath the reset gate being held at the reset level will in effect function as the floating diffusion region; as a result, the static capacity of the floating diffusion region increases to lower the charge detection sensitivity.

However, the reset gate section of the solid-state image capturing device described in Japanese Patent Laid-Open No. 331706/1999 is of a surface channel type, so it has the disadvantage of undergoing deterioration in S/N ratio. To be more specific, since the area beneath the reset gate is used as the charge accumulating floating diffusion region, charges in that area are captured by traps in the semiconductor surface and the accumulated signal charges will not be smoothly reset as required and the trapped charges will flow again into the floating diffusion region, occasionally causing adverse effects on the output signal.

As a further problem, Japanese Patent Laid-Open No. 331706/1999 only teaches a camera system capable of switching between the two modes, one for reading one pixel and the other for reading more than one pixel, by using the above-described solid-state image capturing device. This camera system is not considered to make the most of the variability of charge detection sensitivity.

SUMMARY OF THE INVENTION

The present invention has been accomplished in order to solve the aforementioned problems and provides a solid-state image capturing device that has a simple enough configuration to alter the charge detection sensitivity without deteriorating S/N ratio. The invention also provides an imaging apparatus that can obtain an optimum imaging signal in various situations using the solid-state image capturing device capable of altering the charge detection sensitivity.

The solid-state image capturing device of the invention has a photoelectric transducer portion, a charge transfer portion for transferring a signal charge from said photoelectric transducer portion and a charge detector portion for detecting said signal charge; said charge detector portion comprises a floating diffusion section to which said signal charge is transferred, a reset drain section for draining said floating diffusion section of accumulated charges, and a reset gate section of buried-channel type which is provided between said floating diffusion section and said reset drain section; and said reset gate section has a plurality of reset electrodes that are provided adjacent to each other in the channel direction and which can be driven independently of each other. With this simple configuration, charges captured by traps in the semiconductor surface will not flow again into the floating diffusion region to cause unwanted effects on the output signal and, as a result, the charge detection sensitivity can be easily altered without deteriorating S/N ratio.

The solid-state image capturing device of the invention may be so configured that if said plurality of reset electrodes are sequentially driven to a reset potential in order from the reset electrode which is closer to said floating diffusion section, the static capacity of said floating diffusion section increases in geometric ratio. This configuration offers the advantage of enabling simple arithmetic operation in signal processing when detection output for the same pixel is determined with a plurality of detection sensitivities.

The imaging apparatus of the invention uses the above-described solid-state image capturing device which has a drive portion for outputting a drive signal to said solid-state image capturing device.

In the imaging apparatus of the invention, at least one of said reset electrodes including the one positioned the closest to said floating diffusion section may be driven by said drive portion at either a reset potential or an intermediate potential between said reset potential and a barrier potential. With this configuration, a knee characteristic can be added to signals for imaged pictures.

In the imaging apparatus of the invention, said drive portion may change the drive pattern of said plurality of reset electrodes before said signal charge is drained from said floating diffusion section. This configuration expands the dynamic range of signals for imaged pictures.

In the imaging apparatus of the invention, said drive portion may change the drive pattern of said plurality of reset electrodes according to the color information possessed by the signal charge. The drive pattern according to said color information may be determined in accordance with a detection signal obtained for each color when a white object is imaged. This configuration enables efficient processing for white balance.

In the imaging apparatus of the invention, said drive portion may change the drive pattern of said plurality of reset electrodes for each image display. This configuration expands the dynamic range of signals for imaged pictures in processing for assembling a plurality of displays to provide a single display.

In the imaging apparatus of the invention, said drive portion may change the drive pattern of said plurality of reset electrodes according to the object being imaged.

DESCRIPTION OF THE PREFERRED EMBODIMENTS

Figure 1:
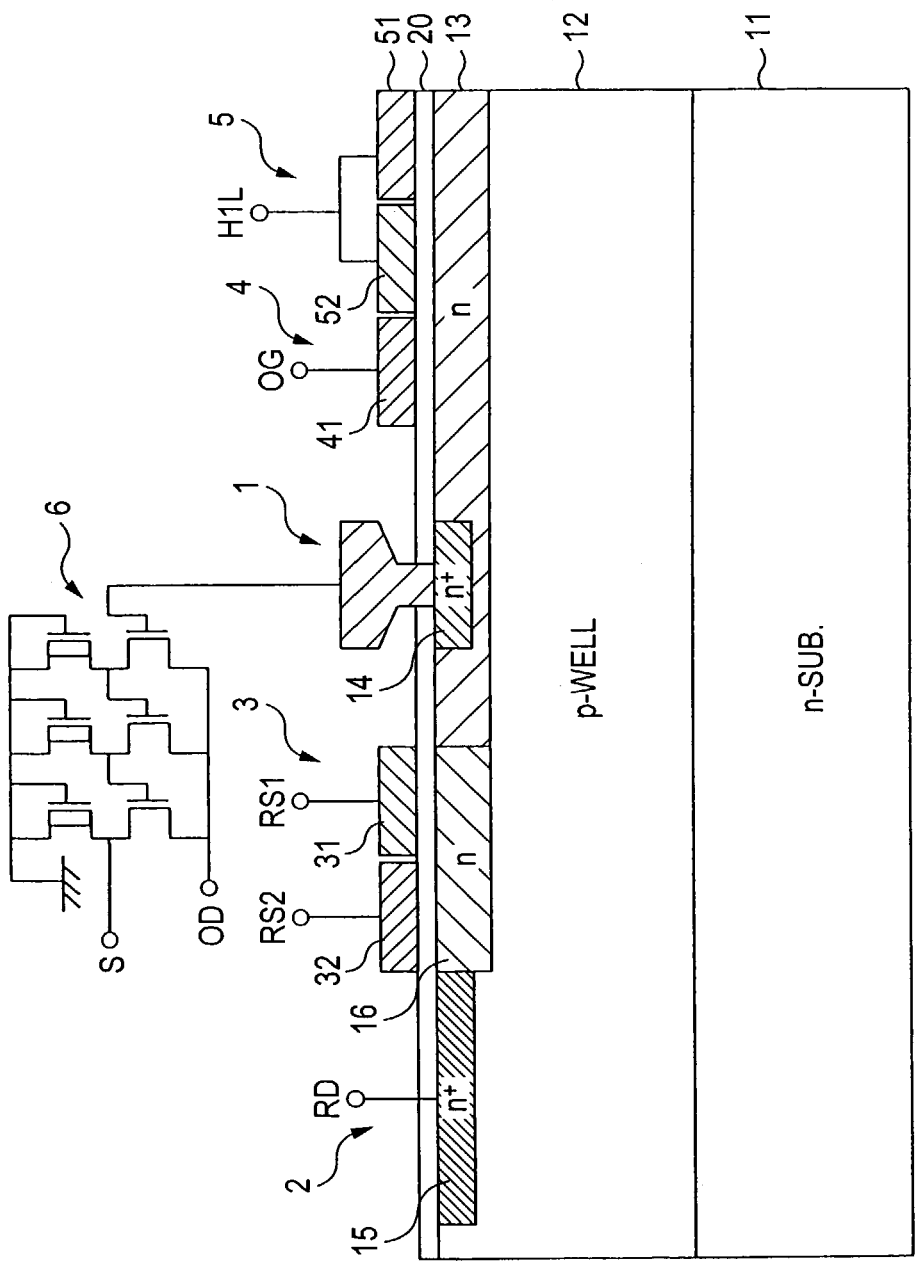
FIG. 1 shows a schematic configuration of a solid-state image capturing device according to a mode for carrying out the invention, particularly the area around the charge detector portion.
Figure 12:
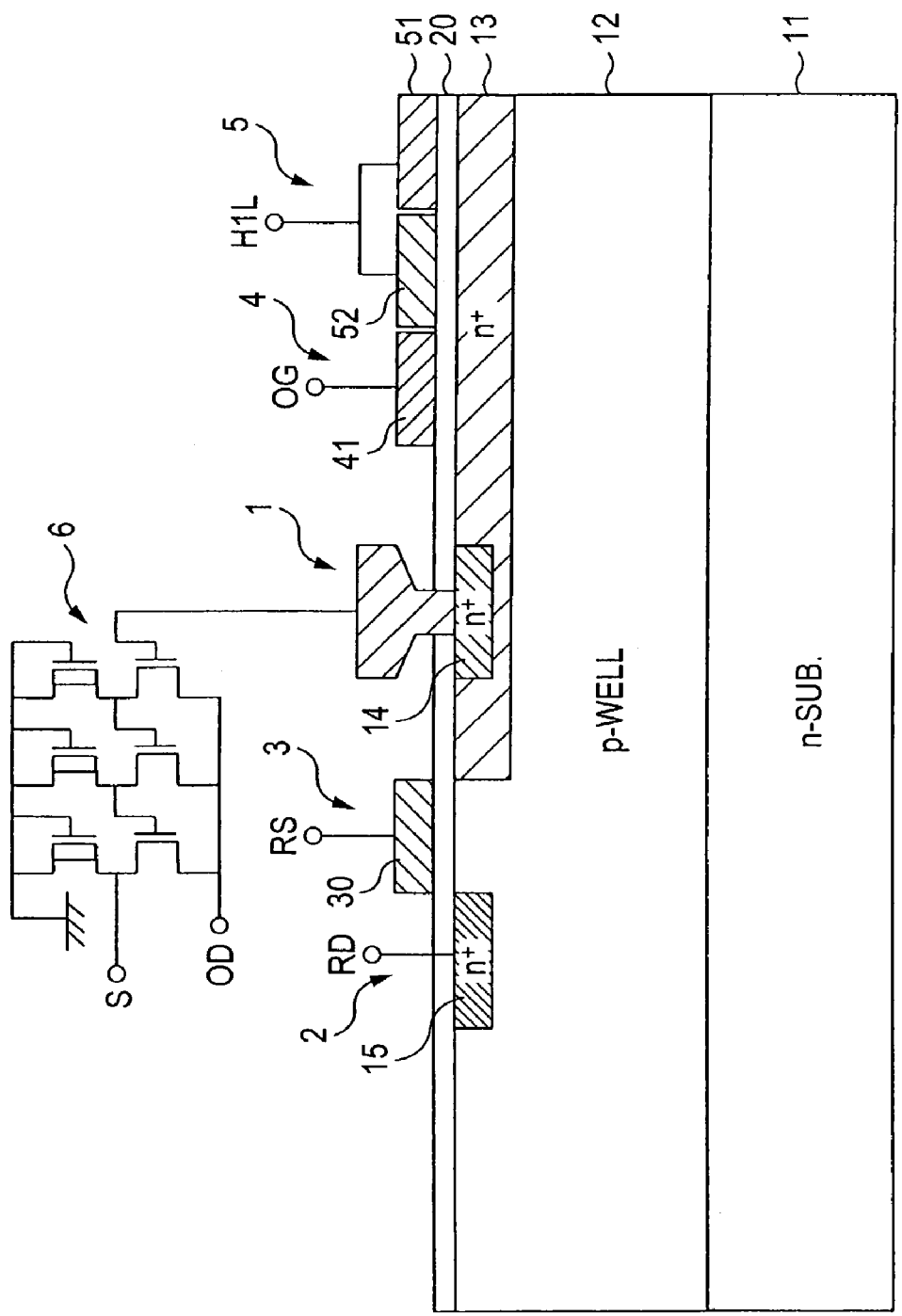
FIG. 12 shows a schematic configuration of a conventional CCD image capturing device, particularly the area around the charge detector portion.

On the pages that follow, modes for carrying out the invention are described with reference to accompanying drawings. FIG. 1 shows a schematic configuration of a solid-state image capturing device according to a mode for carrying out the invention, particularly the area around the charge detector portion. The solid-state image capturing device shown in FIG. 1 includes the final transfer stage 5 of a horizontal CCD (transfer channel), an output gate section 4, a floating diffusion section 1, a reset gate section 3, a reset drain section 2 and a source follower circuit 6; except for the reset gate section 3, the solid-state image capturing device shown in FIG. 1 has the same configuration as the image capturing device shown in FIG. 12. The reset gate section 3 includes an n-type buried region 16 formed between the floating diffusion region 14 and the reset drain region 15 in a p-type well 12, as well as reset electrodes 31 and 32 that are formed on the surface of the buried region 16, with an insulation film 20 interposed. The reset electrodes 31 and 32 are provided adjacent to each other in the channel direction of the reset gate section 3 and can be driven independently of each other.

We now describe the method of driving the solid-state image capturing device shown in FIG. 1. When there is a need to drive the solid-state image capturing device at high sensitivity, terminal RS2 of the reset electrode 32 which is the closer to the reset drain section 2 is fixed at high level (reset level) and the terminal RS1 of the reset electrode 31 which is the closer to the floating diffusion section 1 is driven in synchronism with a drive pulse Hlast from the charge transfer portion (see FIG. 2). If the solid-state image capturing device is driven in this way, it is first reset when the terminal RS2 is at high level and then the drive pulse Hlast drops to low level (barrier level), whereupon a signal charge is transferred from the charge transfer channel to the floating diffusion region 14.

Figure 5:
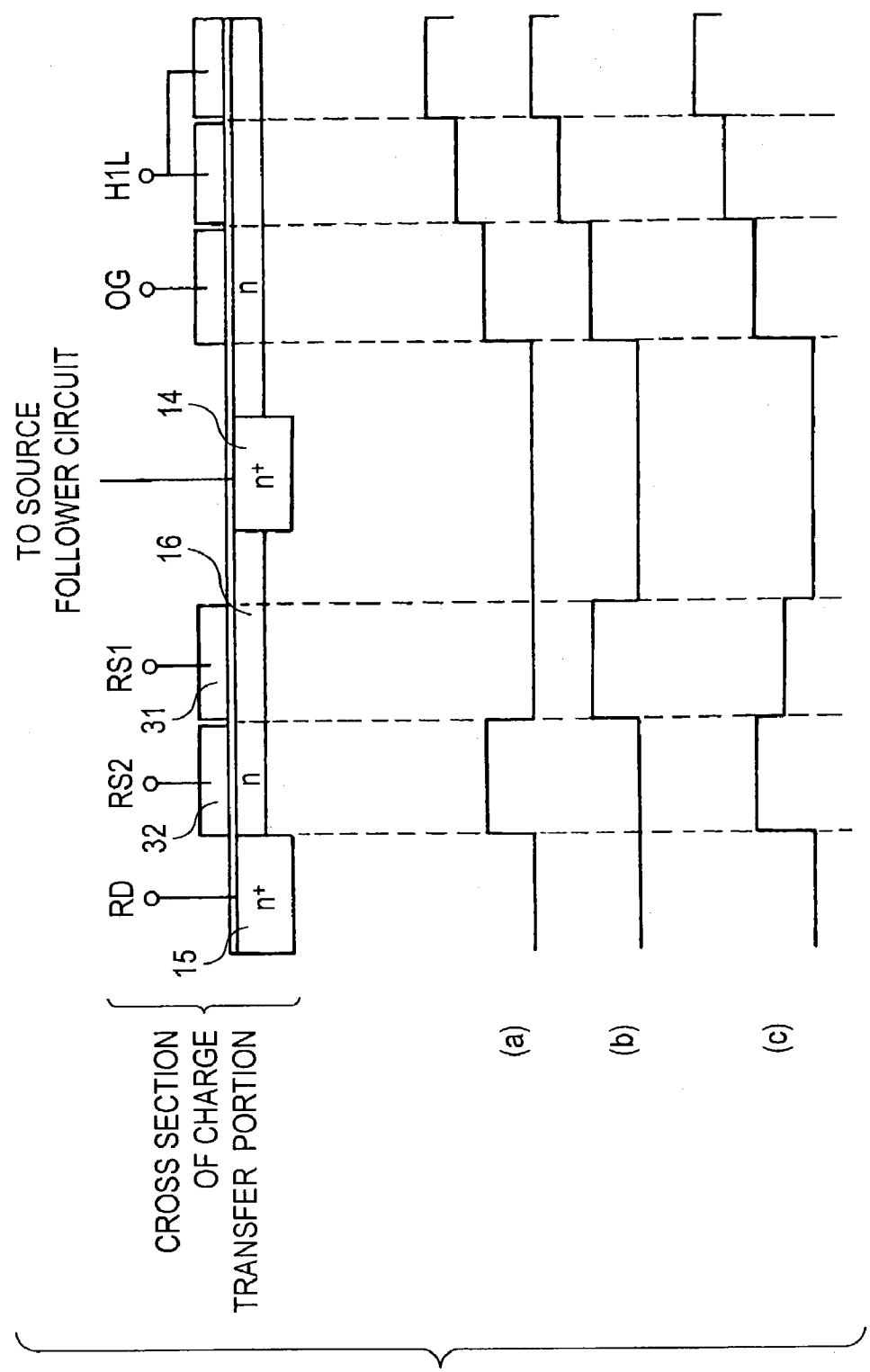
FIG. 5 shows a potential distribution that occurs around the charge detector portion of the solid-state image capturing device shown in FIG. 1.

As a result, a potential distribution occurs around the charge detector portion as shown in FIG. 5B. Since the signal charge that was only transferred to the floating diffusion region 14 is accumulated, the static capacity of the floating diffusion region 14 depends on the structure of the floating diffusion section 1 and is generally small. Therefore, the charge detection output (CCD OUT) as delivered from the terminal S of the source follower circuit 6 that is connected to the floating diffusion region 14 has high sensitivity. This output is first subjected to analog signal processing and then sent to a DSP (not shown) that performs digital signal processing.

Consider now the case of driving the solid-state image capturing device at low sensitivity. As shown in FIG. 3, the terminal RS1 is fixed at high level (reset level) and the terminal RS2 is driven in synchronism with the drive pulse Hlast from the charge transfer portion. If the solid-state image capturing device is driven in this way, the potential distribution shown in FIG. 5A occurs around the charge detector portion when a signal charge is transferred from the charge transfer channel to the floating diffusion region 14. In this state, the transferred signal charge is accumulated not only in the floating diffusion region 14 but also under the reset electrode 31 and, as the result, the capacity of the floating diffusion region 14 becomes greater than when the potential distribution is as shown in FIG. 5B. Hence, the charge detection output (CCD OUT) as delivered from the terminal S of the source follower circuit 6 has lower sensitivity than in the case shown in FIG. 2.

If the solid-state image capturing device is driven as shown in FIG. 3, signal charges are also accumulated under the reset electrode 31. In the solid-state image capturing device of FIG. 1, the n-type buried region 16 is formed beneath the reset electrodes 31 and 32 to design the reset gate section 3 as a buried channel structure and this allows charges to be accumulated in an area just below the surface of the substrate. Therefore, when the terminal RS2 os the reset electrode 32 is brought to high level to reset the solid-state image capturing device, the accumulated signal charges can be smoothly cleared to the reset drain region and this prevents trapped charges from flowing again into the floating diffusion region 14 to cause unwanted effects on the charge detection output.

Figure 2:
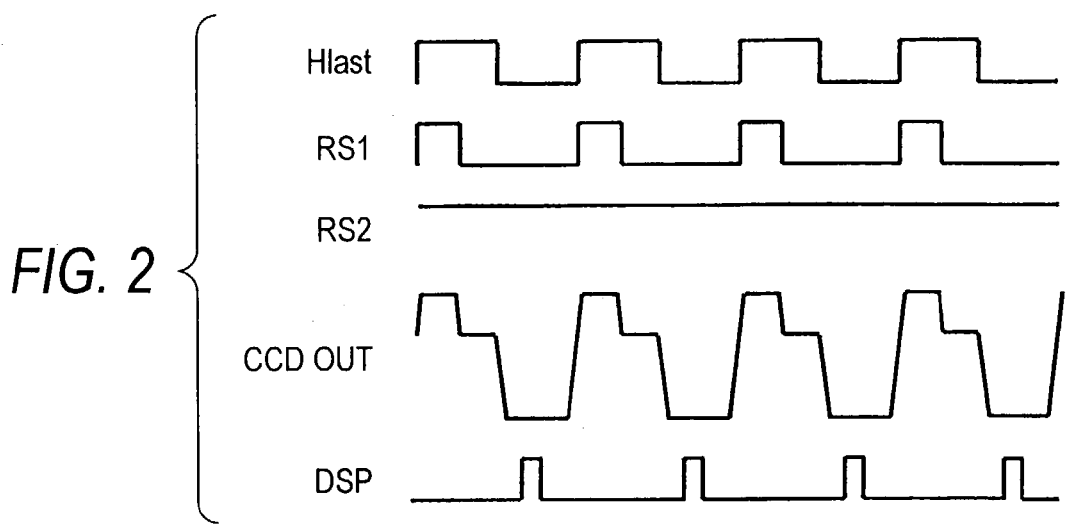
FIG. 2 is a timing chart for the case where the solid-state image capturing device of FIG. 1 is driven at high sensitivity.
Figure 3:
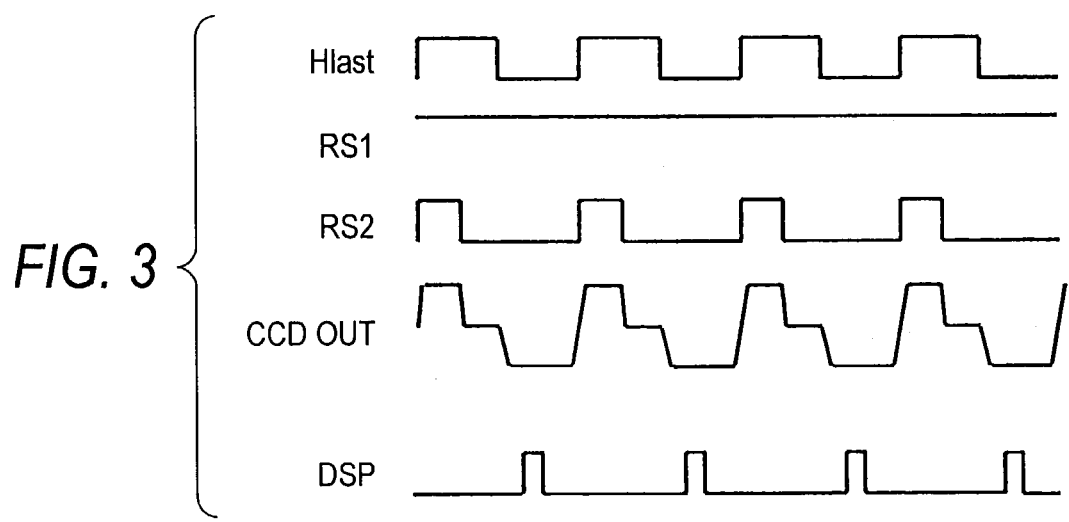
FIG. 3 is a timing chart for the case where the solid-state image capturing device of FIG. 1 is driven at low sensitivity.

Altering the charge detection sensitivity by individually driving the reset electrodes 31 and 32 as shown in FIGS. 2 and 3 is not the only mode for operating the solid-state image capturing device shown in FIG. 1. If desired, the reset electrodes 31 and 32 may be driven simultaneously to provide a charge detection output with a knee characteristic.

In order to provide a charge detection output with a knee characteristic, the terminals RS1 and RS2 are driven simultaneously in synchronism with the drive pulse Hlast from the charge transfer portion. Note that the terminal RS2 is driven as in the case shown in FIG. 3 (i.e., high level provides reset level and low level provides barrier level) but the terminal RS1 is driven such that high level provides reset level whereas low level provides an intermediate potential between the reset and barrier levels. If the solid-state image capturing device is driven in this way, the potential distribution shown in FIG. 5C occurs around the charge detector portion when a signal charge is transferred from the charge transfer channel to the floating diffusion region 14. As is clear from FIG. 5C, when the transferred signal charge is no more than a predetermined level, it is only accumulated in the floating diffusion region 14 and, hence, the static capacity of the floating diffusion region 14 is small and the charge detection sensitivity is high. If the transferred signal charge exceeds a predetermined level, it is also accumulated below the reset electrode 31 and, hence, the static capacity of the floating diffusion region 14 increases to lower the charge detection sensitivity As a result, imaging signals are obtained that can be detected with such a knee characteristic that the detection sensitivity is high when the signal charge (incident light) is limited but becomes small in response to an increased signal charge. If the intermediate level of the drive signal to the terminal RS1 is altered, the quantity of charge accumulation that lowers the static capacity of the floating diffusion region 14 is changed and this technique can be employed to control the quantity of signal charge that lowers the detection sensitivity.

Figure 6:
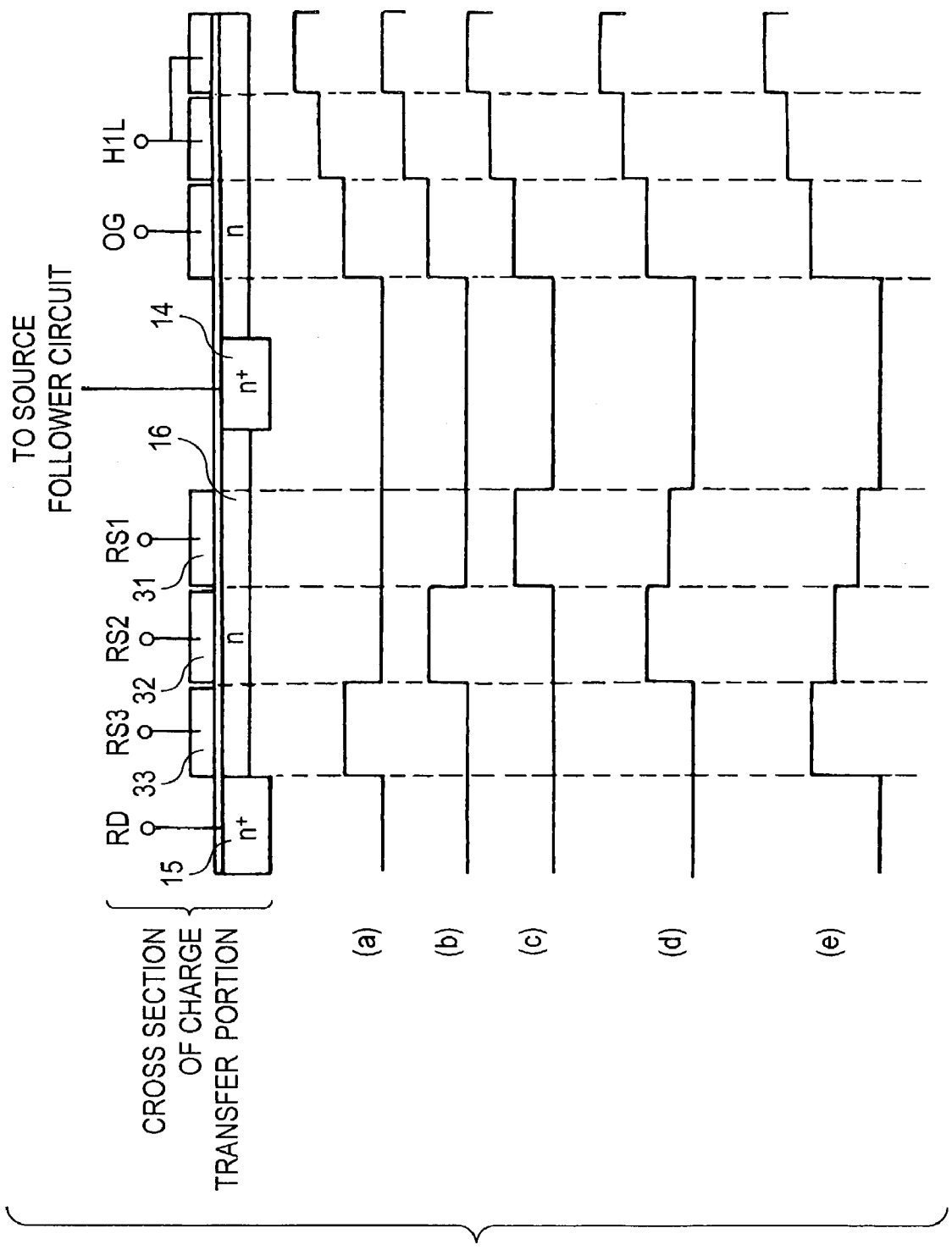
FIG. 6 shows a potential distribution that occurs around the charge detector portion of a solid-state image capturing device having three reset electrodes.

In the solid-state image capturing device of FIG. 1, two reset electrodes 31 and 32 are provided on the surface of the buried region 16, with the insulation film 20 interposed. However, the number of reset electrodes that can be provided is by no means limited to two. FIG. 6 shows a cross-sectional profile and a potential distribution for the charge detector portion of a solid-state image capturing device provided with three reset electrodes. The solid-state image capturing device of FIG. 6 is essentially the same as the one shown in FIG. 1, except that a third reset electrode 33 is provided adjacent the reset electrode 32.

The method of driving the solid-state image capturing device shown in FIG. 6 is also the same as the method of driving the one shown in FIG. 1; either one of the reset electrodes 31, 32 and 33 is driven in synchronism with the drive pulse Hlast from the charge transfer portion and the other reset electrodes are fixed at reset level. If the solid-state image capturing device is driven in this way, charge detection output can obtained at three levels of charge detection sensitivity, high, medium and low. The resulting potential distributions that occur around the charge detector portion are shown in FIGS. 6A, 6B and 6C.

FIG. 6A shows the potential distribution that occurs when the terminal RS1 of the reset electrode 31 and the terminal RS2 of the reset electrode 32 are fixed at reset level and the terminal RS3 of the reset electrode 33 is driven in synchronism with the drive pulse Hlast. In the case under consideration, the transferred signal charge is also accumulated beneath the reset electrodes 31 and 32, so the static capacity of the floating diffusion region 14 increases to lower the charge detection sensitivity. If the terminals RS2 and Rs3 are fixed at reset level and the terminal RS1 is driven in synchronism with the drive pulse Hlast, the potential distribution shown in FIG. 6C occurs and the charge detection sensitivity obtained is as high as in the case shown in FIG. 5B. If the terminals RS1 and RS3 are fixed at reset level and the terminal RS2 is driven in synchronism with the drive pulse Hlast, the potential distribution shown in FIG. 6B occurs and obviously the charge detection sensitivity obtained is intermediate between the levels shown in FIGS. 6A and 6C.

Figure 4:
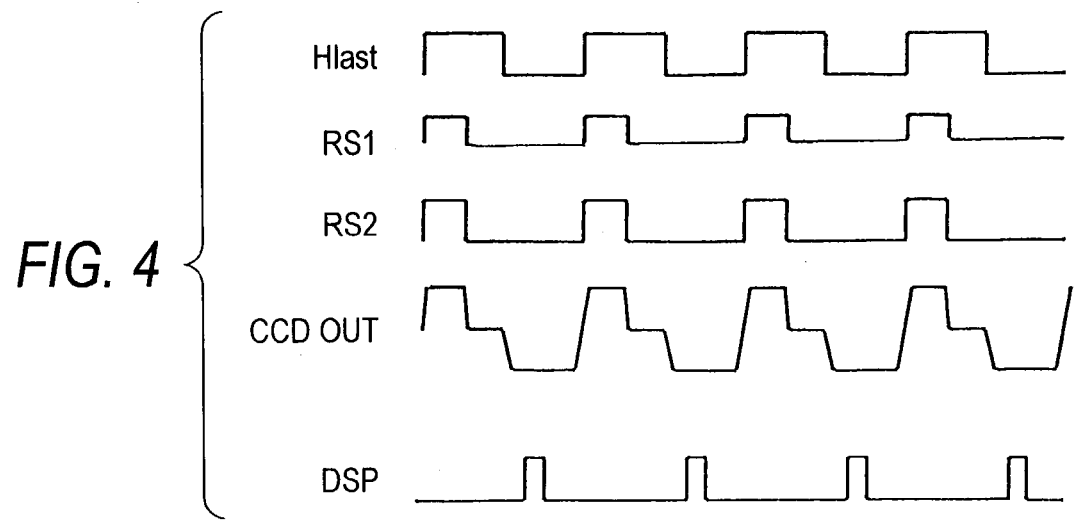
FIG. 4 is a timing chart for the case where the solid-state image capturing device of FIG. 1 is driven with a knee characteristic.

In another embodiment, the two reset electrodes 31 and 32 or 32 and 33, or the three reset electrodes 31, 32 and 33 may be driven simultaneously to provide a charge detection output having a knee characteristic as in the case of the solid-state image capturing device shown in FIG. 1. FIG. 6D shows a potential distribution that occurs when the terminal RS3 is fixed at reset level and the terminals RS1 and RS2 are driven in synchronism with the drive pulse Hlast. Obviously, the characteristic obtained is the same as what is obtained when the solid-state image capturing device of FIG. 1 is driven as shown in FIG. 4. If the three reset electrodes 31, 32 and 33 are driven simultaneously, the potential distribution shown in FIG. 6E occurs to provide a knee characteristic in which the charge detection sensitivity changes at two points.

As described above, the solid-state image capturing device of the invention is capable of altering the charge detection sensitivity; in addition, the absolute value of the sensitivity can be designed at any level by controlling various parameters such as the size of the reset electrodes and the dielectric constant of the buried region 16. Therefore, if the charge detection sensitivity is varied in geometric ratio according to which reset electrode is driven, simple arithmetic operations will suffice to provide picture signals over a wide dynamic range when signal processing is performed by determining detection output for the same pixel with a plurality of detection sensitivities. For example, the charge detection sensitivity in the cases of FIGS. 6A and 6B may be designed to become ¼ and 1/16, respectively, of the value obtained in the case of FIG. 6C.

Figure 7:
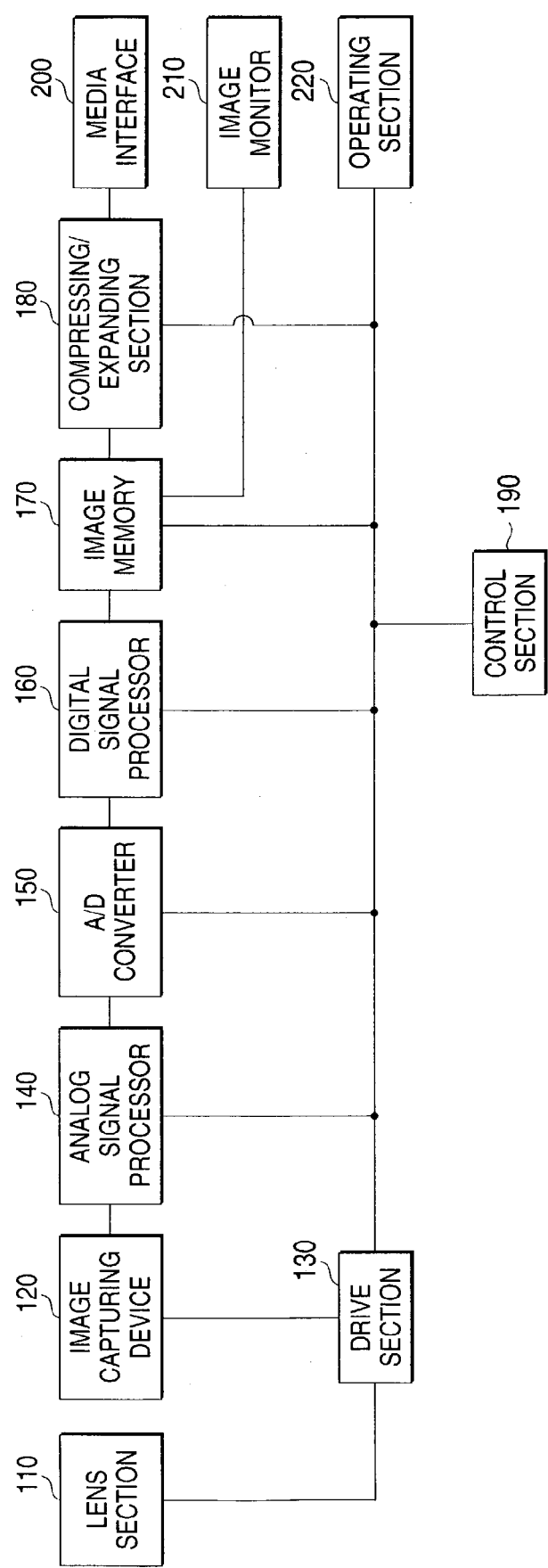
FIG. 7 is a diagram showing a schematic configuration of a digital camera.

We next describe the imaging apparatus of the invention that uses the solid-state image capturing device shown in FIG. 1 or 6. FIG. 7 shows a schematic configuration for a digital camera as an example of the imaging apparatus using the solid-state image capturing device of the invention. The digital camera shown in FIG. 7 is configured to comprise an imaging portion comprising a lens section 110, a solid-state image capturing device 120 and a drive section 130, a signal processing portion comprising an analog signal processor section 140, an A/D converter section, a digital signal processor section 160, an image memory 170 and a compressing/expanding section 180, an output portion comprising a media interface 200 and an image monitor 210, an operating portion 220 and a control portion 190 for controlling the overall digital camera.

Light passing through the lens section 110 is focused on the solid-state image capturing device 120 shown in FIG. 1 or 6 and an amount of signal charges associated with the quantity of incident light are accumulated in a plurality of photoelectric transducers. On this occasion, the lens section 1 and a stop diaphragm (not shown) are controlled by means of the drive section 130. In an imaging mode, the solid-state image capturing device 120 is driven on a predetermined timing with the drive section 130 including a timing generator (not shown) and outputs a signal for imaged picture that is associated with the accumulated signal charges. When a release button (not shown) on the operating portion 220 is pushed, an imaging operation is accordingly performed.

Under the control of the control portion 190, the drive section 130 outputs drive signals to the lens section 110 and the solid-state image capturing device 120. These drive signals may directly control the lens section 110 and the solid-state image capturing device 120 or they may be control signals for such direct drive signals. For example, in the case of a reset signal to be applied to a reset electrode in the solid-state image capturing device, the drive section 130 may output a signal with a controlled voltage level or it may output only a timing signal and use a voltage level that was generated either within or outside the solid-state image capturing device. Driving of the solid-state image capturing device 120 with the drive section 130 will be described later.

The signal for imaged picture is subjected to analog signal processing in the analog signal processor section 140, then converted to a digital signal in the A/D converter section 150, and subjected to digital signal processing in the digital signal processor section 160 before it is recorded temporarily in the image memory 170. Processes to be performed with the digital signal processor section 160 include the adjustment of white balance, Y/C processing and γ correction. If an image based on the information for imaged picture that has been subjected to digital image processing is to be displayed on the image monitor 210, the content of the image memory 170 is read out of it and sent to the image monitor 170. When an imaging operation is to be performed in response to pushing of the release button, the information for imaged picture from the image memory 170 is compressed in the compressing/expanding section 180 and passes through the media interface 200 to be recorded on a recording medium such as a memory card (not shown).

If an image based on the image information recorded on the recording medium is to be displayed on the image monitor 210, the image information read from the recording medium is expanded in the compressing/expanding section 180, written to the output memory 170 and then sent to the image monitor 210.

These steps are performed under the control of the system control portion 190 in response to operating signals from the operating portion 220. The system control portion 190 is chiefly composed of a processor that runs on a predetermined program, together with a memory that contains the program and various kinds of data necessary for executing the steps, as well as a work memory.

The operating portion 220 performs various operations while the digital camera is used; it sets the imaging method, imaging conditions and the method of processing the information for imaged pictures; the operating portion 220 also gives various instructions for the image information stored in the medium (e.g. displaying it and providing additional information). The operating portion 220 may be furnished with operating members that perform the respective functions or it may share the operating members that are operatively associated with displaying on the image monitor 210.

We next describe how the solid-state image capturing device 120 is driven with the drive section 130. The drive section 130 is configured to output one or more of the following five drive signals (drive patterns) under the control of the control portion 190.

(1) Selecting the Charge Detection Sensitivity

One of two levels of charge detection sensitivity can be selected when the solid-state image capturing device shown in FIG. 1 is employed and one of three levels of charge detection sensitivity can be selected when the solid-state image capturing device shown in FIG. 6 is employed. To achieve these results, either one of the reset electrodes is driven in synchronism with a transferred signal and the other reset electrodes are fixed at reset level (see FIGS. 2, 3, 5A, 5B and FIGS. 6A, 6B and 6C).

(2) Providing a Knee Characteristic

In order to provide charge detection sensitivity with a knee characteristic, at least one reset electrode which is provided the closer to the floating diffusion section 1 is driven in synchronism with the other reset electrodes to either a reset potential or an intermediate potential between the reset potential and a barrier potential, as explained with reference to FIGS. 4, 5C and 6D and 6E. If a one-level knee characteristic is desired, the solid-state image capturing device shown in FIG. 1 is employed and the reset electrodes 31 and 32 are driven in synchronism with a drive pulse from the charge transfer portion, provided that the reset electrode 31 is driven at either the reset potential or an intermediate potential between the reset potential and the barrier potential (see FIG. 5C). Alternatively, the solid-state image capturing device shown in FIG. 6 is employed and the reset electrode 33 is fixed at the reset level whereas the reset electrodes 31 and 32 are driven in the same manner as those shown in FIG. 1 (see FIG. 6D). If a two-level knee characteristic is desired, the solid-state image capturing device shown in FIG. 6 is employed and the reset electrodes 31, 32 and 33 are driven in synchronism with a drive pulse from the charge transfer portion, provided that the reset electrodes 31 and 32 are driven at either the reset potential or intermediate potentials between the reset potential and the barrier potential (see FIG. 6E). Note that the intermediate potential for the reset electrode 31 is set higher than the intermediate potential for the reset electrode 32.

(3) Altering the Detection Sensitivity According to Pixel's Color Information

The charge detection sensitivity may be altered for each pixel in accordance with the color information possessed by the signal charge detected with the photoelectric transducer. Examples of the drive signals that may be used in this mode by the solid-state image capturing device of the invention are illustrated in FIGS. 8 and 9.

Figure 8:
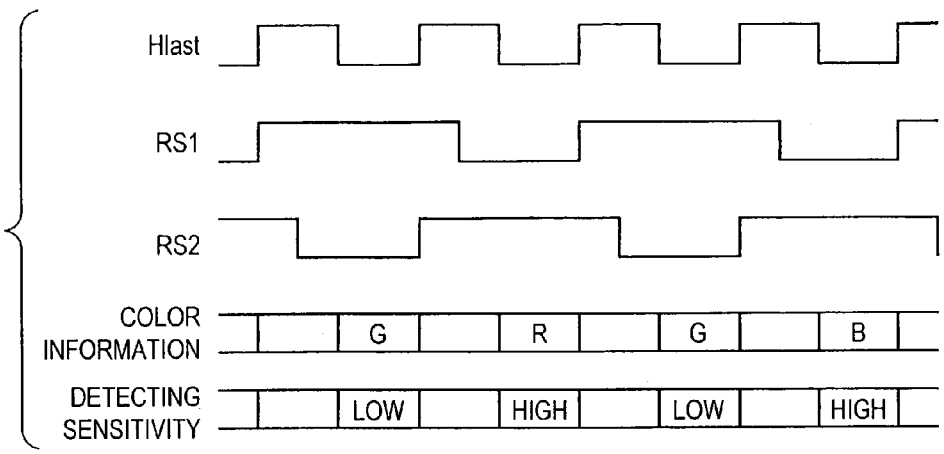
FIG. 8 is a timing chart for the case of driving the solid-state image capturing device with the charge detection sensitivity being altered at two levels for each kind of color information.

FIG. 8 illustrates the case of employing the solid-state image capturing device shown in FIG. 1, provided that pixels with color information for green (G) are detected with low sensitivity whereas pixels with color information for red (R) and blue (B) are detected with high sensitivity. Suppose the reset electrodes 31 and 32 are driven in accordance with the patterns depicted for RS1 and RS2 in FIG. 8; obviously, during detection of pixels with color information for green (G), the reset electrode 31 is at the reset level and the detection sensitivity is low; during detection of pixels with color information for red (R) and blue (B), the reset electrode 31 serves as a barrier electrode and the detection sensitivity is high.

Figure 9:
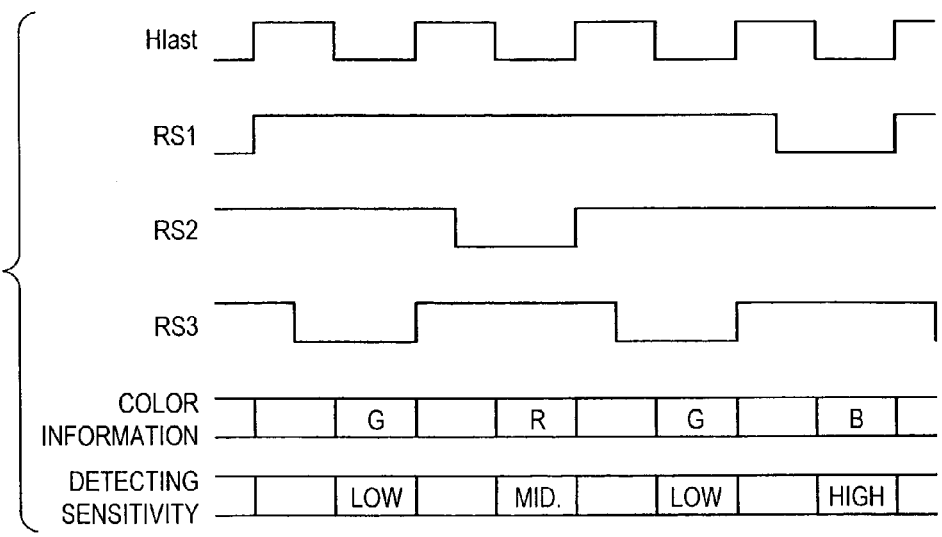
FIG. 9 is a timing chart for the case of driving the solid-state image capturing device with the charge detection sensitivity being altered at three levels for each kind of color information.

FIG. 9 illustrates the case of employing the solid-state image capturing device shown in FIG. 6, provided that pixels with color information for green (G) are detected with low sensitivity, pixels with color information for red (R) are detected with medium sensitivity, and pixels with color information for blue (B) are detected with high sensitivity. Obviously, a different electrode works as the barrier electrode for a different kind of color information and, as the result, the charge detection sensitivity varies at three levels.

Alteration of the charge detection sensitivity in accordance with color information may be effectively used for the purpose of adjusting white balance. If the charge detection signal for one color differs greatly from the charge detection signal for another color, it is difficult to get the desired white balance between signals for imaged pictures; in this case, the charge detection sensitivity may be altered from color to color in order to produce signals for imaged pictures that are easy to process to provide the desired white balance.

(4) Detecting Two Signals for One Pixel

If imaged picture signals that were detected at a plurality of sensitivity levels are to be acquired for one pixel, the drive patterns of the reset electrodes are altered before the signal charges accumulated in the floating diffusion section 1 are cleared to the reset drain section 2 and the detection output is sent to a DSP twice, the first instance before the drive patterns are altered and the second instance after that.

Figure 10:
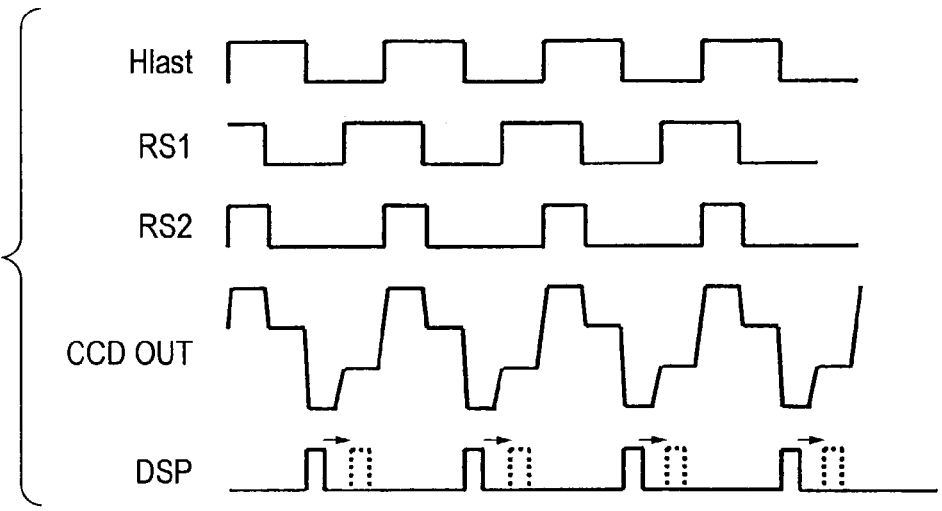
FIG. 10 is a timing chart for the case of driving the solid-state image capturing device with the charge detection sensitivity being altered within the same pixel.
Figure 11:
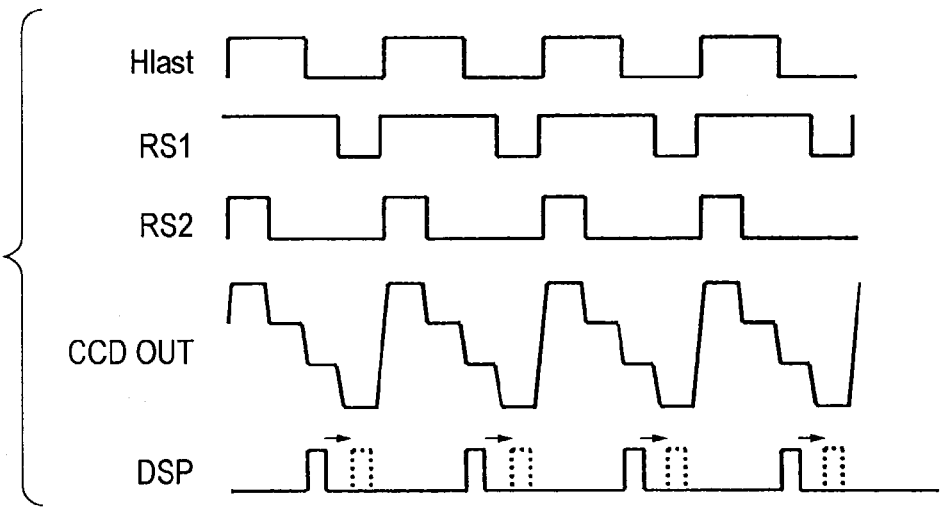
FIG. 11 is another timing chart for the case of driving the solid-state image capturing device with the charge detection sensitivity being altered within the same pixel.

FIG. 10 is a timing chart for drive signals that are used to detect charges first at high sensitivity, then at low sensitivity. As shown, the reset electrodes 31 and 32 are adjusted to reset level so as to drain the accumulated charges; then, both reset electrodes 31 and 32 are brought to barrier level and high-sensitivity detection is performed; thereafter, reset electrode 31 alone is readjusted to reset level and low-sensitivity detection is performed. FIG. 11 is a timing chart for drive signals that are used to detect charges first at low sensitivity, then at high sensitivity. In this case, after clearing the accumulated charges, the reset electrode 32 alone is adjusted to barrier level and low-sensitivity detection is performed and, subsequently, the reset electrode 31 is also adjusted to barrier level and high-sensitivity detection is performed. Either method may be employed but if there is a large amount of charges, low-sensitivity detection is preferably performed first in order to prevent draining of excess charges that are beyond the saturated quantity.

If detection is performed at a plurality of sensitivity levels for one pixel, imaging signals can be obtained over a wide dynamic range by adding up the detection signals in accordance with sensitivity. If, in this case, the charge detection sensitivity of the solid-state image capturing device is varied in geometric ratio by, for example, designing it in such a way that low sensitivity is ¼ or ¹⁄₁₆ of high sensitivity, the added-up imaging signals can be subsequently processed by simple mathematical operations.

(5) Altering the Detection Sensitivity From One Image Display to Another

The charge detection sensitivity can be altered from one image display to another. In this case, by performing an addition for each of the corresponding pixels in a plurality of image displays, imaging signals can be obtained over a wide range as in the case described in (4).

Note that the above-described drive signals (drive patterns) (1)-(5) are selected either automatically or depending upon which imaging mode (what subject is to be imaged under what conditions) has been set by the operating portion 220. For example, the providing of a knee characteristic and the pattern of the knee characteristic to be provided may be selected depending upon the conditions under which imaging is to be performed (whether it is effected at nighttime or what is the condition of illumination).

As will be apparent from the foregoing explanation, the present invention provides a solid-state image capturing device that has a simple enough configuration to alter the charge detection sensitivity without deteriorating S/N ratio. The invention also provides an imaging apparatus that can obtain an optimum imaging signal in various situations using the solid-state image capturing device capable of altering the charge detection sensitivity.

What is claimed is:

1. A solid-state image capturing device having a photoelectric transducer portion, a charge transfer portion for transferring a signal charge from said photoelectric transducer portion and a charge detector portion for detecting said signal charge, in which said charge detector portion comprises:

a floating diffusion section to which said signal charge is transferred;

a reset drain section for draining said floating diffusion section of accumulated charges; and a reset gate section of buried-channel type which is provided between said floating diffusion section and said reset drain section, wherein said reset gate section has a plurality of reset electrodes that are provided adjacent to each other in the channel direction and which can be driven independently from each other, wherein at least one of said plurality of reset electrodes can be driven with a reset potential, a baffler potential, and an intermediate potential in between the reset and baffler potentials, and wherein at least two reset electrodes of said plurality of reset electrodes are driven concomitantly, and driving levels of said at least two reset electrodes are correlated with driving levels of a drive pulse from said charge transfer portion.

2. The solid-state image capturing device according to claim 1, wherein if said plurality of reset electrodes are sequentially driven to a reset potential in order from the reset electrode which is closer to said floating diffusion section, the static capacity of said floating diffusion section increases in geometric ratio.

3. An imaging apparatus having at least the solid-state image capturing device which has a drive portion for outputting a drive signal to said solid-state image capturing device, wherein said solid-state image capturing device has a photoelectric transducer portion, a charge transfer portion for transferring a signal charge from said photoelectric transducer portion and a charge detector portion for detecting said signal charge, further wherein said charge detector portion comprises:

a floating diffusion section to which said signal charge is transferred;

a reset drain section for draining said floating diffusion section of accumulated charges; and a reset gate section of buried-channel type which is provided between said floating diffusion section and said reset drain section, wherein said reset gate section has a plurality of reset electrodes that are provided adjacent to each other in the channel direction and which can be driven independently from each other, wherein at least one of said plurality of reset electrodes can be driven with a reset potential, a barrier potential, and an intermediate potential in between the reset and baffler potentials, and wherein at least two reset electrodes of said plurality of reset electrodes are driven concomitantly, and driving levels of said at least two reset electrodes are correlated with driving levels of a drive pulse from said charge transfer portion.

4. The imaging apparatus according to claim 3, wherein said plurality of reset electrodes includes a reset electrode positioned closest to said floating diffusion section and said reset electrode positioned closest to said floating diffusion section is driven by said drive portion with either the reset potential or the intermediate potential between said reset potential and the barrier potential.

5. The imaging apparatus according to claim 3, wherein said drive portion changes a drive pattern of the drive signal of said plurality of reset electrodes before said signal charge is drained from said floating diffusion section.

6. A solid-state image capturing device having a photoelectric transducer portion, a charge transfer portion for transferring a signal charge from said photoelectric trans-
ducer portion and a charge detector portion for detecting said signal charge, in which said charge detector portion comprises:

a floating diffusion section to which said signal charge is transferred;

a reset drain section for draining said floating diffusion section of accumulated charges; and a reset gate section of buried-channel type which is provided between said floating diffusion section and said reset drain section, wherein said reset gate section has a plurality of reset electrodes that are provided adjacent to each other in the channel direction and which can be driven independently from each other, wherein a drive pattern of the drive signal of said plurality of reset electrodes is changed according to the color information possessed by the signal charge, and wherein at least two reset electrodes of said plurality of reset electrodes are driven concomitantly, and driving levels of said at least two reset electrodes are correlated with driving levels of a drive pulse from said charge transfer portion.

7. The imaging apparatus according to claim 6, wherein the drive pattern according to said color information is determined in accordance with a detection signal obtained for each color when a white object is imaged.

8. The imaging apparatus according to claim 3, wherein said drive portion changes a drive pattern of the drive signal of said plurality of reset electrodes for each image display.

9. The imaging apparatus according to claim 3, wherein said drive portion changes a drive pattern of the drive signal of said plurality of reset electrodes according to the object being imaged.

10. The imaging apparatus according to claim 4, wherein said drive portion changes a drive pattern of the drive signal of said plurality of reset electrodes for each image display.

11. The imaging apparatus according to claim 5, wherein said drive portion changes the drive pattern of the drive signal of said plurality of reset electrodes for each image display.

12. The imaging apparatus according to claim 4, wherein said drive portion changes a drive pattern of the drive signal of said plurality of reset electrodes according to the object being imaged.

13. The imaging apparatus according to claim 5, wherein said drive portion changes the drive pattern of the drive signal of said plurality of reset electrodes according to the object being imaged.

14. The imaging apparatus according to claim 3, wherein the drive portion changes a driving pattern applied to the plurality of reset electrodes based on a desired brightness sensitivity to an image captured by the solid-state image capturing device.

15. The imaging apparatus according to claim 3, wherein the drive portion applies a first driving pattern to the plurality of reset electrodes for an image captured by the solid-state image capturing device and applies a second driving pattern, different from the first driving pattern, to the plurality of reset electrodes for the same image captured by the solid-state image capturing device.

16. The imaging apparatus according to claim 15, wherein one of the first and second driving patterns is a high-sensitive driving pattern and the other of the first and second driving patterns is a low-sensitive driving pattern.

17. A method of transferring a signal charge from a photoelectric transducer portion of a solid-state image capturing device to a charge detector portion of the solid-state image capturing device, comprising:

draining accumulated charges in a floating diffusion section of the charge detector portion; and transferring the signal charge from the photoelectric transducer portion to the floating diffusion section while applying driving voltage potentials to a plurality of reset electrodes of a reset gate section of the charge detector portion, wherein at least one of the reset electrodes can be driven with a reset potential, a baffler potential, and an intermediate potential in between the reset and baffler potentials, and at least two reset electrodes of said plurality of reset electrodes are driven concomitantly, and driving levels of said at least two reset electrodes are correlated with driving levels of a drive pulse from a charge transfer portion used for transferring said signal charge from said photoelectric transducer portion.

18. The method according to claim 17, wherein in the transferring step, the driving voltage potentials applied to the plurality of reset electrodes are based on a color information of the signal charge.

19. The method according to claim 17, wherein in the transferring step, the driving voltage potentials applied to the plurality of reset electrodes are based on a charge level of the signal charge.

20. The method according to claim 19, wherein in the charge level of the signal charge corresponds to a brightness level of an image captured by the solid-state image capturing device.

21. The method according to claim 17, further comprising changing a driving pattern applied to the plurality of reset electrodes for image captured.

22. The method according to claim 17, further comprising changing a driving pattern applied to the plurality of reset electrodes based on an image captured by the solid-state image capturing device.

23. The method according to claim 17, further comprising:

applying a first driving pattern to the plurality of reset electrodes for an image captured by the solid-state image capturing device; and applying a second driving pattern, different from the first driving pattern, to the plurality of reset electrodes for the same image captured by the solid-state image capturing device.

24. The method according to claim 23, wherein one of the first and second driving patterns is a high-sensitive driving pattern and the other of the first and second driving patterns is a low-sensitive driving pattern.

25. The method according to claim 17, wherein in the transferring step, the driving voltage potentials are applied to the plurality of reset electrodes of the reset gate section of a buried-channel type.

26. The solid-state image capturing device according to claim 1, wherein said at least two reset electrodes are driven simultaneously in synchronism with said drive pulse from said charge transfer portion, to provide a charge detection output with a knee characteristic.

27. The imaging apparatus according to claim 3, wherein said at least two reset electrodes are driven simultaneously in synchronism with said drive pulse from said charge transfer portion, to provide a charge detection output with a knee characteristic.

28. The solid-state image capturing device according to claim 6, wherein said at least two reset electrodes are driven simultaneously in synchronism with said drive pulse from said charge transfer portion, to provide a charge detection output with a knee characteristic.

29. The method according to claim 17, further comprising:

driving said at least two reset electrodes simultaneously in synchronism with said drive pulse from said charge transfer portion, to provide a charge detection output with a knee characteristic.

* * * * *